United States Patent
Yoo et al.

(10) Patent No.: US 9,842,934 B2
(45) Date of Patent: Dec. 12, 2017

(54) ARRAY SUBSTRATE AND METHOD OF FABRICATING THE SAME

(71) Applicant: LG Display Co., Ltd., Seoul (KR)

(72) Inventors: Yong-Woo Yoo, Paju-si (KR);
Sang-Hyun Bae, Daegu-si (KR);
Ju-Yeon Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/392,949

(22) Filed: Dec. 28, 2016

(65) Prior Publication Data
US 2017/0110592 A1 Apr. 20, 2017

Related U.S. Application Data

(62) Division of application No. 13/678,369, filed on Nov. 15, 2012, now Pat. No. 9,564,532.

(30) Foreign Application Priority Data

Apr. 23, 2012 (KR) .......................... 10-2012-0042126

(51) Int. Cl.
| | |
|---|---|
| *H01L 29/10* | (2006.01) |
| *H01L 29/786* | (2006.01) |
| *H01L 21/44* | (2006.01) |
| *H01L 27/12* | (2006.01) |
| *H01L 29/66* | (2006.01) |

(Continued)

(52) U.S. Cl.
CPC ........ *H01L 29/78618* (2013.01); *H01L 21/44* (2013.01); *H01L 27/1225* (2013.01); *H01L 29/66969* (2013.01); *H01L 29/7869* (2013.01); *H01L 29/78696* (2013.01); *G02F 1/1368* (2013.01); *H01L 27/3262* (2013.01)

(58) Field of Classification Search
USPC ........................................................ 257/40
See application file for complete search history.

(56) References Cited

U.S. PATENT DOCUMENTS

| 7,511,300 B2 | 3/2009 | Lee et al. |
| 2007/0013077 A1 | 1/2007 | Lee et al. |

(Continued)

FOREIGN PATENT DOCUMENTS

| CN | 1897269 A | 1/2007 |
| CN | 1897270 A | 1/2007 |

(Continued)

*Primary Examiner* — Cuong Q Nguyen
*Assistant Examiner* — Nishath Yasmeen
(74) *Attorney, Agent, or Firm* — Birch, Stewart, Kolasch & Birch, LLP

(57) ABSTRACT

A method of manufacturing an array substrate is discussed. The method includes forming a gate line on a substrate including a pixel region, forming a gate electrode on the substrate and connected to the gate line, and forming a gate insulating layer on the gate line and the gate electrode. The method further includes forming a data line on the gate insulating layer and crossing the gate line to define the pixel region, forming a source electrode and a drain electrode on the gate insulating layer and corresponding to the gate electrode, the source electrode connected to the data line and the drain electrode spaced apart from the source electrode, and forming an oxide semiconductor layer on top of the source and drain electrodes.

6 Claims, 10 Drawing Sheets

(51) Int. Cl.
*H01L 27/32* (2006.01)
*G02F 1/1368* (2006.01)

(56) References Cited

U.S. PATENT DOCUMENTS

| | | |
|---|---|---|
| 2007/0013078 A1 | 1/2007 | Lee et al. |
| 2007/0108446 A1* | 5/2007 | Akimoto ............ H01L 29/41733 257/61 |
| 2007/0122649 A1* | 5/2007 | Lee ..................... H01L 29/458 428/674 |
| 2008/0002124 A1 | 1/2008 | Yang |
| 2008/0227243 A1* | 9/2008 | Yang ..................... H01L 29/458 438/159 |
| 2008/0009108 A1 | 10/2008 | Lin et al. |
| 2009/0020758 A1 | 1/2009 | Lee et al. |
| 2009/0057672 A1 | 3/2009 | Kobayashi et al. |
| 2009/0127550 A1* | 5/2009 | Imai ..................... H01L 29/7869 257/43 |
| 2010/0102314 A1 | 4/2010 | Miyairi et al. |
| 2010/0117074 A1 | 5/2010 | Yamazaki et al. |
| 2010/0117076 A1 | 5/2010 | Akimoto et al. |
| 2010/0117086 A1 | 5/2010 | Akimoto et al. |
| 2010/0193782 A1 | 8/2010 | Sakata |
| 2010/0244029 A1 | 9/2010 | Yamazaki et al. |
| 2011/0031493 A1 | 2/2011 | Yamazaki et al. |
| 2011/0157507 A1 | 6/2011 | Koh |
| 2011/0175088 A1 | 7/2011 | Kim et al. |
| 2011/0210327 A1 | 9/2011 | Kondo et al. |
| 2011/0263079 A1 | 10/2011 | Wang |
| 2011/0309510 A1 | 12/2011 | Lee et al. |
| 2012/0126227 A1 | 5/2012 | Maeda et al. |
| 2012/0292610 A1* | 11/2012 | Wang ................ H01L 29/42384 257/43 |

FOREIGN PATENT DOCUMENTS

| | | |
|---|---|---|
| CN | 101105615 A | 1/2008 |
| CN | 101132011 A | 2/2008 |
| CN | 101728434 A | 6/2010 |
| CN | 101740631 A | 6/2010 |
| CN | 101740633 A | 6/2010 |
| CN | 101800249 A | 8/2010 |
| CN | 101853884 A | 10/2010 |
| CN | 101997003 A | 3/2011 |
| CN | 102116984 A | 7/2011 |
| JP | 64-30290 A | 2/1989 |
| JP | 2010-135771 A | 6/2010 |
| WO | WO 2011/013683 A1 | 2/2011 |

\* cited by examiner wet-etching

ARRAY SUBSTRATE AND METHOD OF FABRICATING THE SAME

CROSS REFERENCE TO RELATED APPLICATIONS

This application is a Divisional of U.S. application Ser. No. 13/678,369 filed on Nov. 15, 2012, which claims the benefit of Korean Patent Application No. 10-2012-0042126 filed in Korea on Apr. 23, 2012, which is hereby incorporated by reference.

BACKGROUND OF THE INVENTION

Field of the Invention

The present invention relates to an array substrate and more particularly to an array substrate including an oxide semiconductor layer on top of source and drain electrodes and a method of fabricating the array substrate that reduces production processes.

Discussion of the Related Art

Flat panel display devices have a thin profile, light weight and low power consumption. Among these devices, an active matrix type liquid crystal display (LCD) device is widely used for notebook computers, monitors, TV, and so on instead of a cathode ray tube (CRT), because of their high contrast ratio and characteristics adequate to display moving images.

On the other hand, an organic electroluminescent display (OELD) device is also widely used because of their high brightness and low driving voltage, e.g., 5 to 15 V. In addition, because the OELD device is a self-emission type, the OELD device has a high contrast ratio, a thin profile and a fast response time. In addition, both the LCD and OELD devices include an array substrate with a thin film transistor (TFT) as a switching element in each pixel for turning on and off the pixel.

In more detail, FIG. 1 is a cross-sectional view showing one pixel region of a related art array substrate. In FIG. 1, a gate electrode 15 is formed on a substrate 11 and in a switching region "TrA", where a TFT "Tr" is formed inside a pixel region "P". A gate line connected to the gate electrode 15 is also formed along a first direction. A gate insulating layer 18 is formed on the gate electrode 15 and the gate line, and a semiconductor layer 28 including an active layer 22 of intrinsic amorphous silicon and an ohmic contact layer 26 of impurity-doped amorphous silicon is formed on the gate insulating layer 18 and in the switching region "TrA".

Further, a source electrode 36 and a drain electrode 38 are formed on the semiconductor layer 28 and in the switching region "TrA". As shown, the source electrode 36 is spaced apart from the drain electrode 38, and a data line 33 connected to the source electrode 36 is formed along a second direction. The data line 33 crosses the gate line to define the pixel region "P". In addition, the gate electrode 15, the gate insulating layer 18, the semiconductor layer 28, the source electrode 36 and the drain electrode 38 constitute the TFT "Tr".

Further, a passivation layer 42 including a drain contact hole 45 is formed to cover the TFT "Tr". A pixel electrode 50 connected to the drain electrode 38 through the drain contact hole 45 is formed on the passivation layer 42. In FIG. 1, first and second patterns 27 and 23, which are respectively formed of the same material as the ohmic contact layer 26 and the active layer 22, are formed under the data line 33.

In the semiconductor layer 28 of the TFT "Tr", the active layer 22 of intrinsic amorphous silicon has a difference in a thickness. Namely, the active layer 22 has a first thickness "t1" under the ohmic contact layer 26 and a second thickness "t2" at a center. The first thickness "t1" is different from the second thickness "t2". In addition, the (t1≠t2) Properties of the TFT "Tr" are degraded by the thickness difference in the active layer 22. The thickness difference in the active layer 22 results from a fabricating process.

Recently, the TFT including a single semiconductor layer of an oxide semiconductor material without the ohmic contact layer has been introduced. Because the oxide semiconductor TFT does not need the ohmic contact layer, a dry-etching process for etching the ohmic contact layer is not performed. As a result, the oxide semiconductor layer does not have a thickness difference, and thus the properties of the oxide semiconductor TFT are improved.

In addition, the oxide semiconductor layer has a larger mobility as much as several to several tens times than the amorphous silicon semiconductor layer. Thus, there are advantages in using the oxide semiconductor TFT as a switching or driving element. However, when the oxide semiconductor layer is exposed to an etchant for patterning a metal layer, the oxide semiconductor layer is also patterned because the oxide semiconductor material does not have an etching selectivity to the etchant. The molecular structure of the oxide semiconductor material is also damaged by the etchant. As a result, the properties of the TFT are degraded. In particular, in a bias temperature stress (BTS) test, a threshold voltage is significantly varied such that the TFT significantly affects a display quality of the array substrate.

To resolve these problems, the cross-sectional view of FIG. 2 shows an array substrate including the related art TFT "Tr" having a gate electrode 73, a gate insulating layer 75, an oxide semiconductor layer 77 on a substrate 71, and an etch-stopper 79 of an inorganic insulating material formed on the oxide semiconductor layer 77. Thus, when a metal layer is patterned using an etchant to form source and drain electrodes 81 and 83, the oxide semiconductor layer 77 is not exposed to the etchant due to the etch-stopper 77. The reference numbers "85", "87" and "89" refer to the passivation layer, the drain contact hole and the pixel electrode, respectively.

However, the array substrate including the oxide semiconductor layer 77 and the etch-stopper 79 requires an additional mask process for the etch-stopper 79. Since the mask process includes coating a photoresist (PR) layer, exposing the PR layer using an exposing mask, developing the exposed PR layer to form a PR pattern, etching a material layer using the PR pattern as an etching mask, and stripping the PR pattern, the mask process includes many disadvantages such as an increase in production costs, a decrease in production yield, and so on.

SUMMARY OF THE INVENTION

Accordingly, one object of the present invention is to provide an array substrate and corresponding fabricating method that substantially obviate one or more of the problems due to limitations and disadvantages of the related art.

Another object of the present invention is to provide an array substrate that prevents damages on an oxide semiconductor layer without an etch-stopper.

Yet another object of the present invention is to provide an array substrate including an oxide semiconductor thin film transistor having improved properties.

Still another object of the present invention is to provide a method of fabricating an array substrate with less mask processes.

To achieve these and other advantages and in accordance with the purpose of the present invention, as embodied and broadly described herein, the present invention provides an array substrate including a substrate including a pixel region; a gate line on the substrate; a gate electrode on the substrate and connected to the gate line; a gate insulating layer on the gate line and the gate electrode; a data line on the gate insulating layer and crossing the gate line to define the pixel region; a source electrode and a drain electrode on the gate insulating layer and corresponding to the gate electrode, the source electrode connected to the data line and the drain electrode spaced apart from the source electrode; and an oxide semiconductor layer on top of the source and drain electrodes.

In another aspect, the present invention provides a method of manufacturing an array substrate, and which includes forming a gate line on a substrate including a pixel region; forming a gate electrode on the substrate and connected to the gate line; forming a gate insulating layer on the gate line and the gate electrode; forming a data line on the gate insulating layer and crossing the gate line to define the pixel region; forming a source electrode and a drain electrode on the gate insulating layer and corresponding to the gate electrode, the source electrode connected to the data line and the drain electrode spaced apart from the source electrode; and forming an oxide semiconductor layer on top of the source and drain electrodes.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 3:
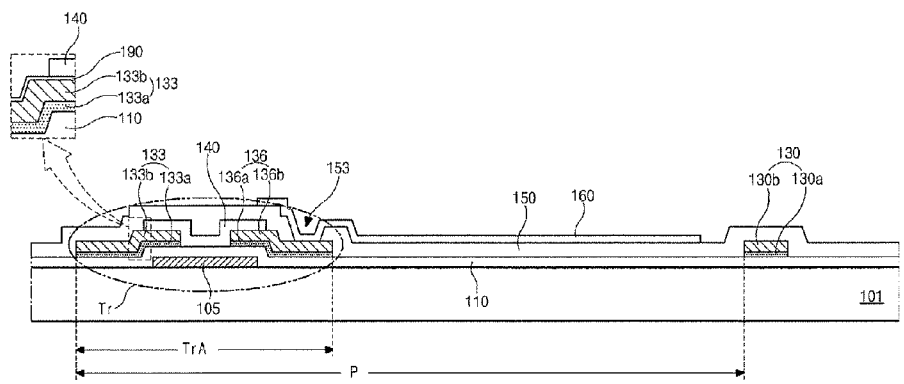
FIG. 3 is a cross-sectional view showing an array substrate including a TFT having an oxide semiconductor layer according to a first embodiment of the present invention.

Reference will now be made in detail to the preferred embodiments, examples of which are illustrated in the accompanying drawings. FIG. 3 is a cross-sectional view showing an array substrate including a TFT having an oxide semiconductor layer according to a first embodiment of the present invention. A switching region "TrA", where a TFT "Tr" is formed" is defined in a pixel region "P".

In FIG. 3, a gate line and a gate electrode 105 are formed on a substrate 101 including transparent glass or plastic, for example. The gate line extends along a direction, and the gate electrode 105 is positioned in the switching region "TrA". Further, the gate electrode 105 may extend from the gate line or may be a portion of the gate line. Each of the gate line and the gate electrode 105 may also have a single layer of a low resistance metallic material, e.g., aluminum (Al), Al alloy, copper (Cu), Cu alloy, molybdenum (Mo) or molybdenum-titanium alloy (MoTi). Alternatively, each of the gate line and the gate electrode 105 may have at least two layers of two or more of the above low resistance metallic material. FIG. 3 shows the gate electrode 105 of the single layer.

When each of the gate line and the gate electrode 105 includes a Cu layer, each of the gate line and the gate electrode 105 further includes a MoTi layer or a Mo layer between the Cu layer and the substrate 101. Further, the Cu layer has a bad contact property with the substrate. However, the problems resulting from the bad contact property between the Cu layer and the substrate 101 are prevented due to the MoTi layer or the Mo layer.

In addition, a gate insulating layer 110 including an inorganic insulating material, e.g., silicon oxide or silicon nitride, is formed on the substrate 101 including the gate line and the gate electrode 105. For example, the gate insulating layer 110 has a single layer of silicon oxide or silicon nitride. Alternatively, the gate insulating layer 110 may have at least two layers of silicon oxide and silicon nitride. When the gate insulating layer 110 has two layers, a lower layer is formed of one of silicon nitride and silicon oxide, and an upper layer is formed of the other one of silicon nitride and silicon oxide. The gate insulating layer 110 can also have multi-layers where silicon oxide layers and silicon nitride layers are alternately stacked.

In addition, a data line 130, a source electrode 133 and a drain electrode 136 are also formed on the gate insulating layer 110. The data line 130 crosses the gate line to define the pixel region "P", and the source and drain electrodes 133 and 136 are positioned in the switching region "TrA". Further, the source electrode 133 extends from the data line 130. The source and drain electrodes 133 and 136 correspond to the gate electrode 105 and are spaced apart from each other. A portion of the gate insulating layer 110 is also exposed through a space between the source and drain electrodes 133 and 136.

The data line 130, the source electrode 133 and the drain electrode 136 respectively have a double-layered structure including a lower layer of Mo or MoTi and an upper layer of Cu or Cu alloy. Namely, the data line 130, the source electrode 133 and the drain electrode 136 respectively include first layers 130a, 133a and 136a as the lower layer and second layers 130b, 133b and 136b as the upper layer. The Cu or Cu alloy layer is used because copper is less expensive and has a relatively high conductivity. In addition, because copper has a bad contact property with the gate insulating layer 110, the Mo or MoTi layer is used to prevent problems resulting from the bad contact property.

In addition, copper or copper alloy has a good contact property with a metallic material but has a bad contact property with an insulating material, such as silicon oxide or silicon nitride, of the gate insulating layer 110. On the other hand, molybdenum or molybdenum-titanium alloy has a good contact property with an insulating material as well as a metallic material. Accordingly, after forming the first layers 130a, 133a and 136a of Mo or MoTi on the gate insulating layer 110, the second layers 130b, 133b and 136b of Cu or Cu alloy are formed on the first layers 130a, 133a and 136a.

Further, an oxide semiconductor layer 140 is formed on the source and drain electrodes 133 and 136. The oxide semiconductor layer 140 is formed of an oxide semiconductor material selected from indium-gallium-zinc-oxide (IGZO), zinc-tin-oxide (ZTO) and zinc-indium-oxide (ZIO) and has an island shape in the switching region "TrA". Further, the oxide semiconductor layer 140 covers an end of the source electrode 133, an end of the drain electrode 136 and the exposed portion of the gate insulating layer 110. The oxide semiconductor layer 140 also corresponds to the gate electrode 105. In other words, the oxide semiconductor layer 140 overlaps the gate electrode 105.

In this instance, the second layers 133b and 136b of Cu or Cu alloy are treated by a plasma process with a nitrogen gas such that a surface modification layer 190 is formed on the second layers 133b and 136b. As a result, there is no problem in a contact property of the oxide semiconductor layer 140 with the source and drain electrodes 133 and 136. Namely, the surface modification layer 190 serves as an adhesion enhancing layer between each of the second layers 133b and 136b and the oxide semiconductor layer 140. The second layer 130b of the data line 130 is also treated by the plasma process.

The gate electrode 105, the gate insulating layer 110, the source electrode 133, the drain electrode 136, the surface enhancing layer 190 and the oxide semiconductor layer 140 constitute the TFT "Tr" as a switching element in the switching region "TrA".

A common line at the same layer and of the same material as the gate line may also be formed to be parallel to the gate line. In addition, a power line being at the same layer and the same material as the gate line or the data line 130 and a driving TFT having the similar structure with the switching element, i.e., the TFT "Tr", may be further formed. In more detail, the driving TFT is electrically connected to the switching element and the power line. In this instance, the array substrate including the power line and the driving element is used for an OELD device.

FIG. 3 also illustrates a passivation layer 150 formed over the substrate 101 including the oxide semiconductor layer 140. The passivation layer 150 covers the oxide semiconductor layer 140, the other ends of the source and drain electrodes 133 and 136, and the data line 130. The passivation layer 150 is formed of an inorganic insulating material, e.g., silicon oxide or silicon nitride, or an organic insulating material, e.g., photo-acryl or benzocyclobutene (BCB). FIG. 3 shows the passivation layer 150 of a single layer. Alternatively, the passivation layer 150 may have a multi-layered structure.

The passivation layer 150 also has a drain contact hole 153 exposing a portion of the drain electrode 136. When the array substrate includes the driving TFT, the passivation layer 150 has a contact hole exposing the drain electrode of the driving TFT. On the other hand, when the array substrate includes a common line, a common contact hole exposing a portion of the common line is formed through the passivation layer 150 and the gate insulating layer 110.

A pixel electrode 160 is then formed in the pixel region "P" on the passivation layer 150. The pixel electrode 160 is formed of a transparent conductive material such as indium-tin-oxide (ITO) and indium-zinc-oxide (IZO), contacts the drain electrode 136 through the drain contact hole 153 and has a plate shape.

In another embodiment, the pixel electrode 160 may have a bar shape, and a common electrode may be further formed to alternating the pixel electrode. The common electrode contacts the common line through the common contact hole and also has a bar shape. In still another embodiment, the pixel electrode may contact the drain electrode of the driving TFT, and an organic emitting layer and a counter electrode may stack on the pixel electrode. In this instance, the pixel electrode, the organic emitting layer and the counter electrode constitute an organic emitting diode.

Thus, as shown in FIG. 3, the present invention is particular advantageous because the oxide semiconductor layer 140 is a top layer on top of the source and drain electrodes 133 and 136. Thus, the oxide semiconductor layer 140 is not damaged when forming the source and drain electrodes 133 and 136 without using the etch-stopper 79.

Figure 1:
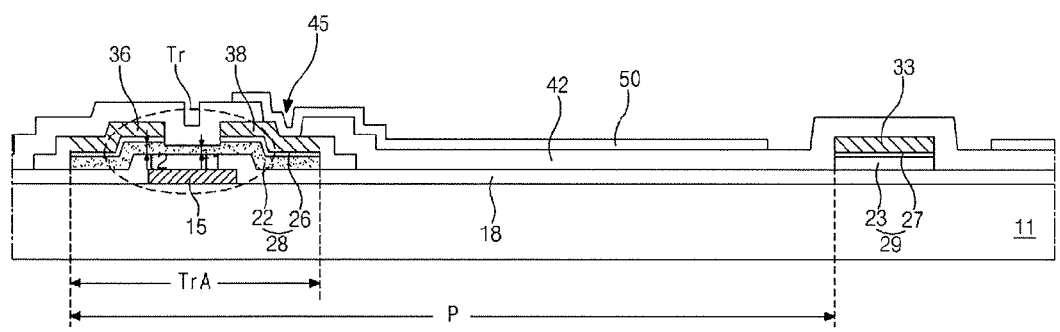
FIG. 1 is a cross-sectional view showing one pixel region of the related art array substrate.
Figure 2:
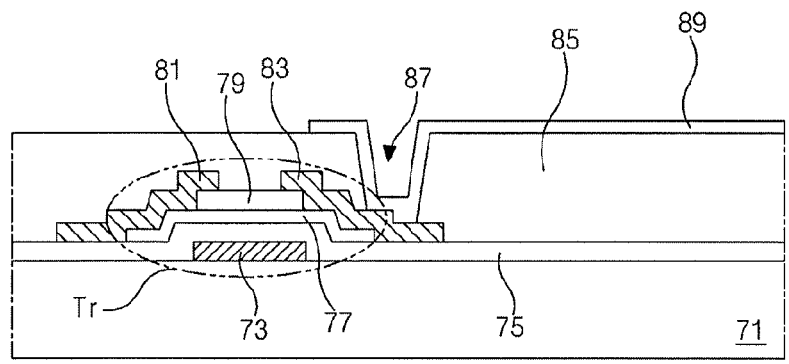
FIG. 2 is a cross-sectional view showing an array substrate including the related art TFT having an oxide semiconductor layer.

In more detail, the present invention advantageously forms the oxide semiconductor layer 140 on top of the source and drain electrodes 133 and 136 and thus does not require the etch-stopper 79 in FIG. 2. Thus, the process of forming the array substrate is faster and more efficient than the process in the related art. In addition, because the oxide semiconductor layer 140 is formed on top of the source and drain electrodes 133 and 136 (which include a metal material), the present invention advantageously provides the adhesion layer 190 to improve the contact between the source and drain electrodes 133 and 136 and the oxide semiconductor layer 140. The oxide semiconductor layer 140 is also advantageously a single layer in the embodiment shown in FIG. 3, and thus does not have different thicknesses as shown in the related art FIG. 1.

In addition, the present invention also advantageously reduces a length of the channel between the source and drain electrodes 133 and 136 in FIG. 3, because the etch-stopper 79 is not needed. That is, as shown in FIG. 2, the etch-stopper 79 is needed to protect the oxide semiconductor layer 77. However, this increases the length of the channel between the source and drain electrodes 81 and 83. As shown in FIG. 3, because the etch-stopper 79 is advantageously not used, the channel between the source and drain electrodes 133 and 136 is reduced compared to the channel length in related art FIG. 2

In addition, because the oxide semiconductor layer 140 is the upper layer and is not damaged in the present invention, the transistor characteristics are greatly improved.

Next, FIGS. 4A to 4G are cross-sectional view views illustrating a fabricating process of an array substrate according to the first embodiment of the present invention. The switching region "TrA", where the TFT "Tr" is formed" is defined in the pixel region "P".

Figure 4A:
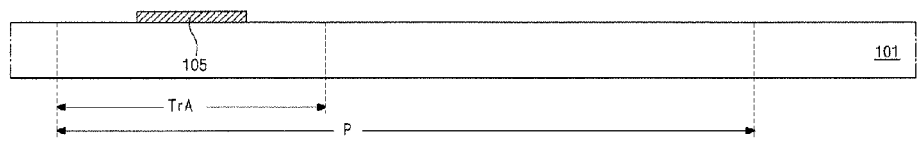
FIGS. 4A to 4G are cross-sectional view views illustrating a fabricating process of an array substrate according to the first embodiment of the present invention.

As shown in FIG. 4A, a first metal layer is formed on the substrate 101 by depositing one or at least two of a first metallic material, e.g., copper (Cu), Cu alloy, aluminum (Al), Al alloy, molybdenum (Mo) or molybdenum-titanium alloy (MoTi). The first metal layer has a single or multi-layered structure.

Next, a mask process is performed which includes coating a PR layer, exposing the PR layer using an exposing mask, developing the exposed PR layer to form a PR pattern, etching a material layer using the PR pattern as an etching mask, and stripping the PR pattern to pattern the first metal layer. As a result, the gate line and the gate electrode 105 are formed on the substrate 101. The gate line extends along a direction, and the gate electrode 105, which is connected to the gate line, is positioned in the switching region "TrA". FIG. 4A shows the gate line and the gate electrode 105 having a single-layered structure.

On the other hand, in another embodiment, the common line, which is parallel to and spaced apart from the gate line, may be formed on the substrate 101 by patterning the first metal layer.

Figure 4B:
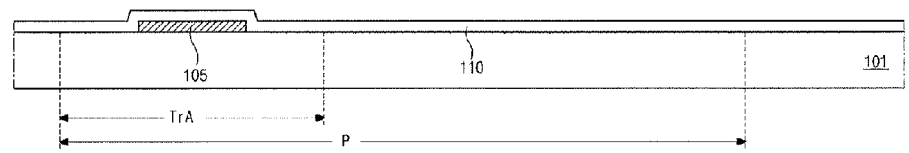

Next, as shown in FIG. 4B, the gate insulating layer 110 is formed on the substrate 101 including the gate line and the gate electrode 105 by depositing an inorganic insulating material, e.g., silicon oxide or silicon nitride. FIG. 4B shows the gate insulating layer 110 of a single-layered structure. Alternatively, the gate insulating layer 110 may have multi-layers where silicon oxide layers and silicon nitride layers are alternately stacked.

Figure 4C:
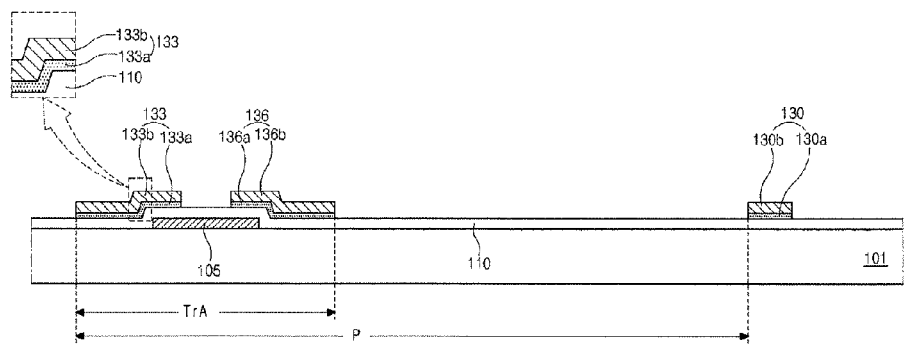

Next, as shown in FIG. 4C, a second metal layer is formed on the gate insulating layer 110 by depositing one of Mo and MoTi, and a third metal layer is sequentially formed on the second metal layer by depositing one of Cu and Cu alloy. Then, the second and third metal layers are patterned by a mask process to form the data line 130, the source electrode 133 and the drain electrode 136.

As mentioned above, the data line 130, the source electrode 133 and the drain electrode 136 respectively have the first layers 130a, 133a and 136a of Mo or MoTi and the second layers 130b, 133b and 136b of Cu or Cu alloy. Further, the data line 130 crosses the gate line to define the pixel region "P", and the source and drain electrodes 133 and 136 are positioned in the switching region "TrA". The source electrode 133 also extends from the data line 130, and the drain electrode 136 is spaced apart from the source electrode 133.

In another embodiment including the driving TFT, when forming the data line 130, the source electrode 133 and the drain electrode 136, the power line, the source electrode of the driving TFT and the drain electrode of the driving TFT are formed. On the other hand, the power line may be formed when forming the gate line and the gate electrode 105.

Figure 4D:
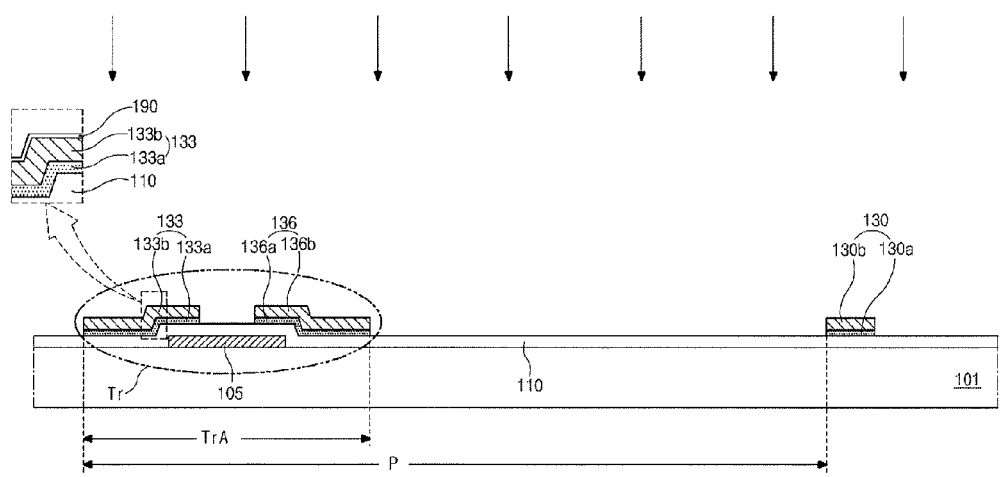

Next, as shown in FIG. 4D, a plasma process with a nitrogen gas is conducted on the data line 130, the source electrode 133 and the drain electrode 136 for about 5 to 15 seconds such that a surface of the second layers 130b, 133b and 136b is modified. As a result, the surface modification layer 190, e.g., a copper-nitride layer, is formed on the second layers 130b, 133b and 136b. Without the surface modification layer 190, the oxide semiconductor layer 140 (of FIG. 4E) has a bad contact or adhesive property with the second layers 130b, 133b and 136b.

Figure 4E:
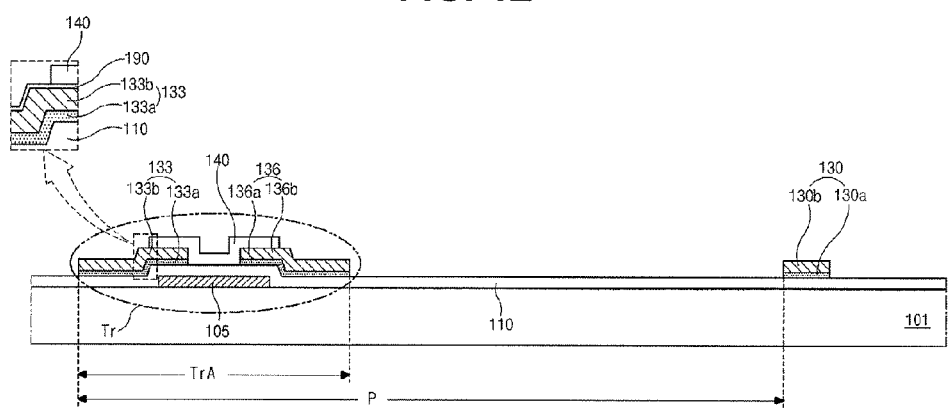

Next, as shown in FIG. 4E, an oxide semiconductor material layer is formed on the substrate 101, where the surface modification layer 190 is formed, by depositing or coating an oxide semiconductor material, e.g., indium-gallium-zinc-oxide (IGZO), zinc-tin-oxide (ZTO) and zinc-indium-oxide (ZIO).

As mentioned above, there is no problem in a contact or adhesive property between the second layers 133b and 136b of the source and drain electrodes 133 and 136 and the oxide semiconductor material layer due to the surface modification layer 190. When the adhesive strength between the Cu layer and the oxide semiconductor material layer is assumed as 1, the adhesive strength between the surface modification layer 190, which is formed by the plasma process with the nitrogen gas onto the Cu layer, and the oxide semiconductor material layer is at least 1.3.

Next, the oxide semiconductor material layer is patterned by a mask process to form the oxide semiconductor layer 140. The oxide semiconductor layer 140 corresponds to the gate electrode 105 and has an island shape. The oxide semiconductor material layer may be patterned by a wet-etching method using an etching including oxalic acid (C2H2O4) with about 5 to 20 weight % or a dry-etching method using an etching gas.

Further, the gate electrode 105, the gate insulating layer 110, the source electrode 133, the drain electrode 136, the surface modification layer 190 and the oxide semiconductor layer 140 constitute the TFT "Tr" as a switching element in the switching region "TrA". In an alternative embodiment, another oxide semiconductor layer corresponding to the gate electrode of the driving TFT is formed on the source and drain electrodes of the driving TFT.

Figure 4F:
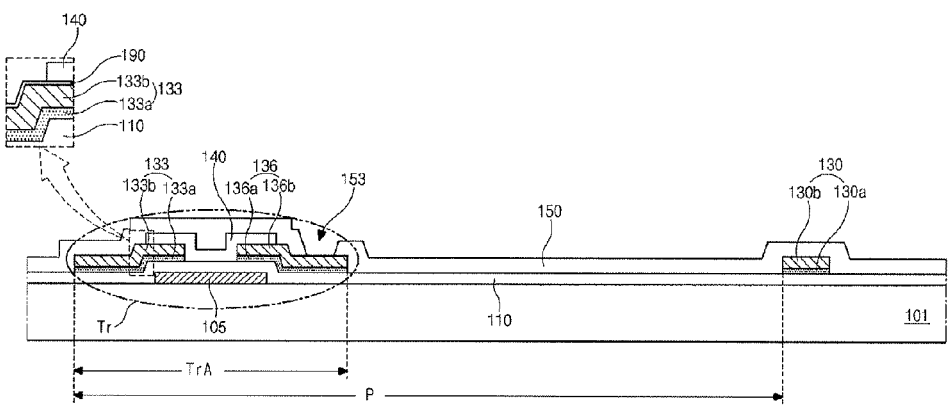

Next, as shown in FIG. 4F, the passivation layer 150 is formed over the substrate 101 including TFT "Tr" by deposing an inorganic insulating material, e.g., silicon oxide or silicon nitride, or coating an organic insulating material, e.g., photo-acryl or benzocyclobutene (BCB). FIG. 4F shows the single layered passivation layer 150 of silicon oxide. Alternatively, the passivation layer 150 may have a multi-layered structure. In this instance, the multi-layered structure passivation layer 150 may include different organic insulating materials or inorganic insulating materials. On the other hand, the passivation layer 150 may include a lower layer of the inorganic insulating material and an upper layer of the organic insulating material.

Next, the passivation layer 150 is patterned by a mask process to form the drain contact hole 153 exposing a portion of the drain electrode 136. In another embodiment, the passivation layer 150 and the gate insulating layer 110 are patterned to form a common contact hole exposing the common line. In addition, in another embodiment, a contact hole exposing the drain electrode of the driving TFT may be formed through the passivation layer 150.

Figure 4G:
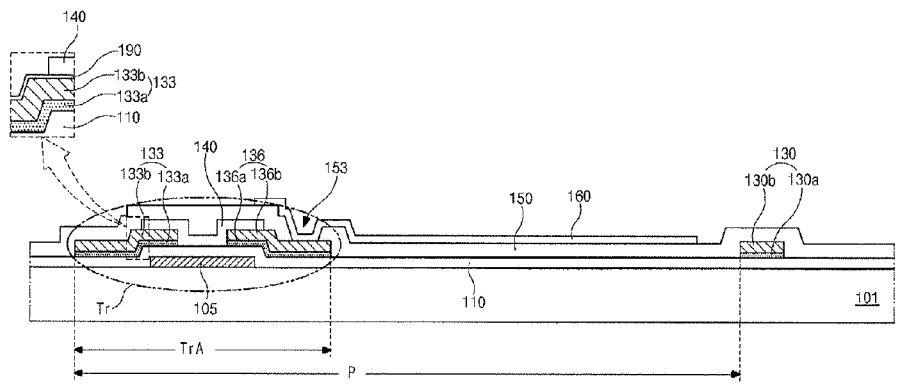

Next, as shown in FIG. 4G, a transparent conductive material layer is formed on the passivation layer 150 by depositing a transparent conductive material, e.g., ITO or IZO. The transparent conductive material layer is patterned by a mask process to form the pixel electrode 160. Further, the pixel electrode 160 has a plate shape and contacts the drain electrode 136 through the drain contact hole 153. As a result, the array substrate is obtained.

In another embodiment, the pixel electrode and the common electrode, each of which has a bar shape, may be formed on the passivation layer 150. In this instance, each of the pixel and common electrodes may be formed of ITO, IZO, Mo or MoTi. The pixel electrode contacts the drain electrode 136 through the drain contact hole 153, and the common electrode contacts the common line through the common contact hole. In addition, the pixel and common electrodes are alternately arranged with each other to form the array substrate for an in-plane switching mode LCD device.

In another embodiment, the pixel electrode contacts the drain electrode of the driving TFT, and the organic emitting layer and the counter electrode are stacked on the pixel electrode. As a result, an array substrate for the OELD device is obtained.

In the present invention, after forming the source electrode 133 and the drain electrode 136, the oxide semiconductor layer 140 is formed. As a result, the oxide semiconductor layer 140 is not exposed to an etchant for patterning the source and drain electrodes 133 and 136 such that there is no damage by the etchant on the oxide semiconductor layer 140. In addition, the array substrate does not need an etch-stopper for protecting a semiconductor layer, and thus the complicated mask process for forming the etch-stopper can be omitted. As a result, the production costs decrease and the efficiency in the production process increases.

Moreover, with the Cu layer, which has an excellent conductive property for the data line 130, the source electrode 133 and the drain electrode 136 and the oxide semiconductor layer 140, which has a high carrier mobility and a bad contact or adhesive property with copper, the oxide semiconductor layer 140 does not peel due to the surface modification layer 190 formed by the plasma process.

Figure 5A:
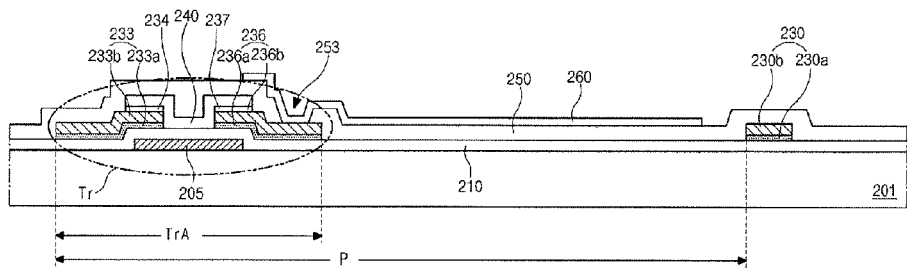
FIGS. 5A and 5B are cross-sectional views showing an array substrate including a TFT having an oxide semiconductor layer according to second and third embodiments of the present invention, respectively.
Figure 5B:
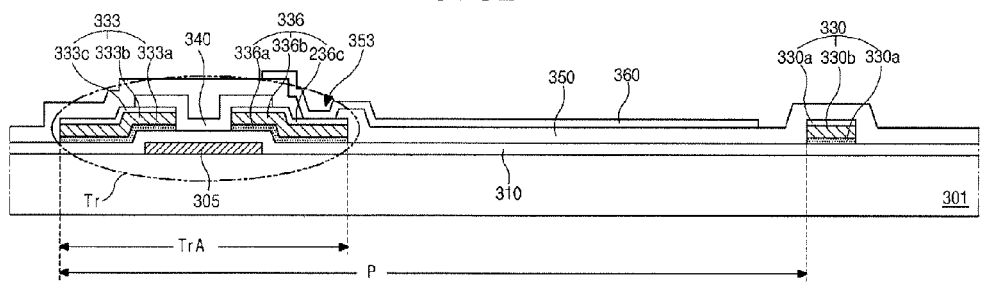

Next, FIGS. 5A and 5B are cross-sectional views showing an array substrate including a TFT having an oxide semiconductor layer according to second and third embodiment of the present invention, respectively. The following explanation is focused on different elements in comparison to the first embodiment.

Referring to FIG. 5A, an array substrate of the second embodiment has a difference in a structure of the source electrode 133 and drain electrode 136 shown in the first embodiment. In more detail, referring to FIG. 3, the source electrode 133 and drain electrode 136 respectively have the first layers 133a and 136a Mo or MoTi and the second layers 133b and 136b of Cu or Cu alloy. Namely, each of the source electrode 133 and the drain electrode 136 has a double-layered structure. In addition, the surface modification layer 190 is formed on the second layers 133b and 136b by performing a plasma process with a nitrogen gas.

However, referring to FIG. 5A, an array substrate 201 of the second embodiment includes a source electrode 233 and a drain electrode 236 respectively have first layers 233a and 236a including Mo or MoTi and second layers 233b and 236b of Cu or Cu alloy, and first and second adhesion enhancing layers 234 and 237 are respectively formed on the source and drain electrodes 233 and 236.

The first and second adhesion enhancing layers 234 and 237 are formed of one of IOT and IZO. Further, the first and second adhesion enhancing layers 234 and 237 partially cover the second layers 233b and 236b such that the oxide semiconductor layer 240 on the first and second adhesion enhancing layers 234 and 237 completely covers an upper layer of each of the first and second adhesion enhancing layers 234 and 237. In this instance, there is no adhesion enhancing layer on a data line 230.

On the other hand, referring to FIG. 5B, an array substrate 301 of the second embodiment includes a data line 330, a source electrode 333 and a drain electrode 336 respectively having first layers 330a, 333a and 336a Mo or MoTi, second layers 330b, 333b and 336b of Cu or Cu alloy and third layers 330c, 333c and 336c of ITO or IZO. Namely, each of the data line 330, the source electrode 333 and the drain electrode 336 has a triple-layered structure. The third layers 330c, 333c and 336c completely cover an upper surface of the second layers 330b, 333b and 336b, respectively.

In the second and third embodiments, the first and second adhesion enhancing layers 234 and 237 and the third layers 333c and 336c are formed to prevent a peeling problem of the oxide semiconductor layers 240 and 340 resulting from a bad contact or adhesion property between the oxide semiconductor material and the metallic material, i.e., Cu or Cu alloy, of the second layers 233b, 236b, 333b and 336b. Namely, the third layers 333c and 336c also serves as an adhesion enhancing layer between each of the second layers 333b and 336b and the oxide semiconductor layer 340.

The adhesive strength between the adhesion enhancing layers 234 and 237 and the oxide semiconductor layer 240 and between the third layers 333c and 336c is at least 1.3 times as larger as the adhesion strength between the second layers 233b and 236b and the oxide semiconductor layer 240 and between the second layers 333b and 336b and the oxide semiconductor layer 340. In addition, in the second and third embodiments, the plasma process with a nitrogen gas, which is used to form the surface modification layer 190, can be omitted.

Next, FIGS. 6A to 6I are cross-sectional view views illustrating a fabricating process of an array substrate according to the second embodiment of the present invention. The switching region "TrA", where the TFT "Tr" is formed" is defined in the pixel region "P".

Figure 6A:
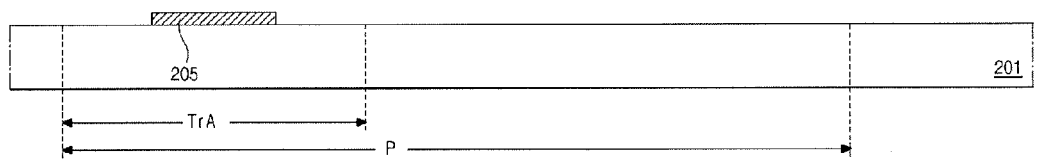
FIGS. 6A to 6I are cross-sectional view views illustrating a fabricating process of an array substrate according to the second embodiment of the present invention.

As shown in FIG. 6A, a first metal layer is formed on the substrate 201 by depositing one or at least two of a first metallic material, e.g., copper (Cu), Cu alloy, aluminum (Al), Al alloy, molybdenum (Mo) or molybdenum-titanium alloy (MoTi). The first metal layer has a single or multi-layered structure. Next, a mask process is performed including coating a PR layer, exposing the PR layer using an exposing mask, developing the exposed PR layer to form a PR pattern, etching a material layer using the PR pattern as an etching mask, and stripping the PR pattern to pattern the first metal layer. As a result, the gate line and the gate electrode 205 are formed on the substrate 201. The gate line extends along a direction, and the gate electrode 205, which is connected to the gate line, is positioned in the switching region "TrA". FIG. 6A shows the gate line and the gate electrode 205 having a single-layered structure.

Figure 6B:
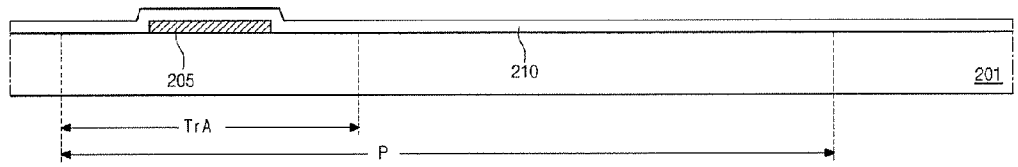

Next, as shown in FIG. 6B, the gate insulating layer 210 is formed on the substrate 201 including the gate line and the gate electrode 205 by depositing an inorganic insulating material, e.g., silicon oxide or silicon nitride. FIG. 6B shows the gate insulating layer 210 of a single-layered structure. Alternatively, the gate insulating layer 110 may have multi-layers where silicon oxide layers and silicon nitride layers are alternately stacked.

Figure 6C:
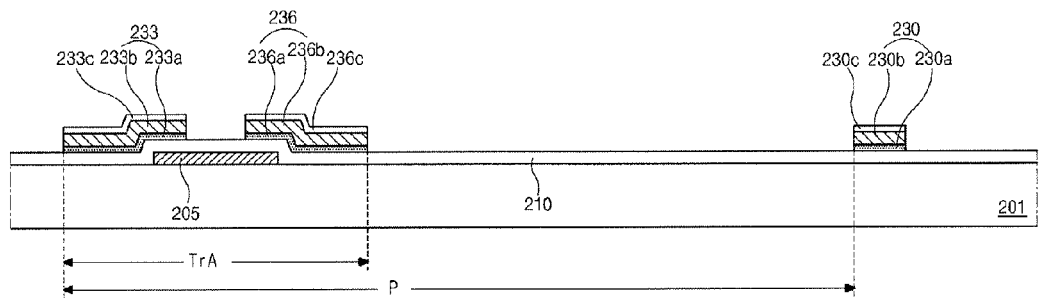

As shown in FIG. 6C, a second metal layer is then formed on the gate insulating layer 110 by depositing one of Mo and MoTi, and a third metal layer is sequentially formed on the second metal layer by depositing one of Cu and Cu alloy. In addition, a transparent conductive layer is formed on the third metal layer by depositing a transparent conductive oxide material, e.g., ITO and IZO.

The second and third metal layers and the transparent conductive layer are patterned by a mask process to form the data line 230, the source electrode 233, the drain electrode 236, and first to third transparent conductive patterns 230c, 233c and 236c. As mentioned above, the data line 230, the source electrode 233 and the drain electrode 236 respectively have the first layers 230a, 233a and 236a of Mo or MoTi and the second layers 230b, 233b and 236b of Cu or Cu alloy.

The data line 230 crosses the gate line to define the pixel region "P", and the source and drain electrodes 233 and 236 are positioned in the switching region "TrA". The source electrode 233 extends from the data line 230, and the drain electrode 236 is spaced apart from the source electrode 233. The first to third transparent conductive patterns 230c, 233c and 236c are formed from the transparent conductive layer and are respectively disposed on the data line 230, the source electrode 233 and the drain electrode 236.

Figure 6D:
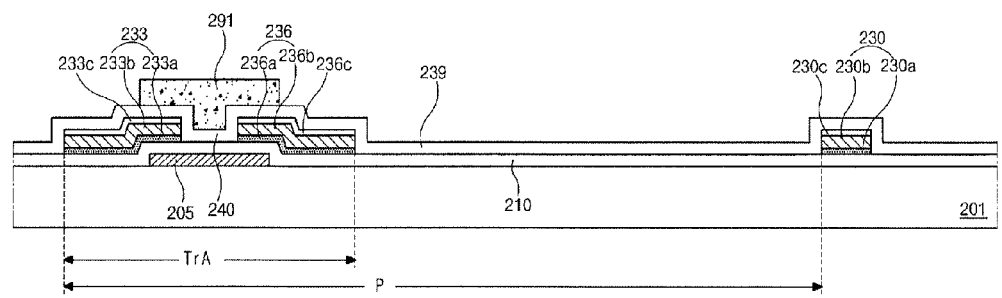

Next, as shown in FIG. 6D, an oxide semiconductor material layer 239 is formed on the substrate 201, where the first to third transparent conductive patterns 230c, 233c and 236c are formed, by depositing or coating an oxide semiconductor material, e.g., indium-gallium-zinc-oxide (IGZO), zinc-tin-oxide (ZTO) and zinc-indium-oxide (ZIO).

Then, a PR layer is formed on the oxide semiconductor layer 239 and is patterned by exposing and developing to form a PR pattern 291. The PR pattern 291 corresponds to a region where the oxide semiconductor layer 240 (of FIG. 6E) will be formed. Next, as shown in FIGS. 6E and 6F, an etching process with an etchant including oxalic acid is performed.

Figure 6E:
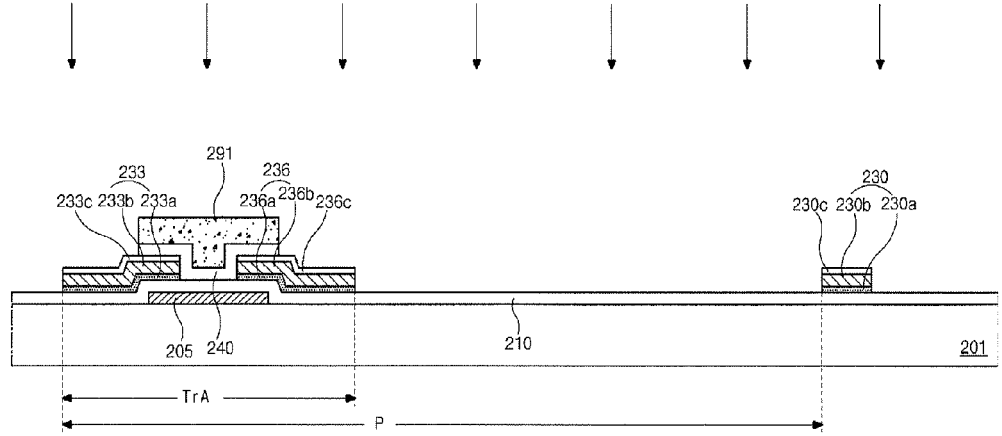
Figure 6F:
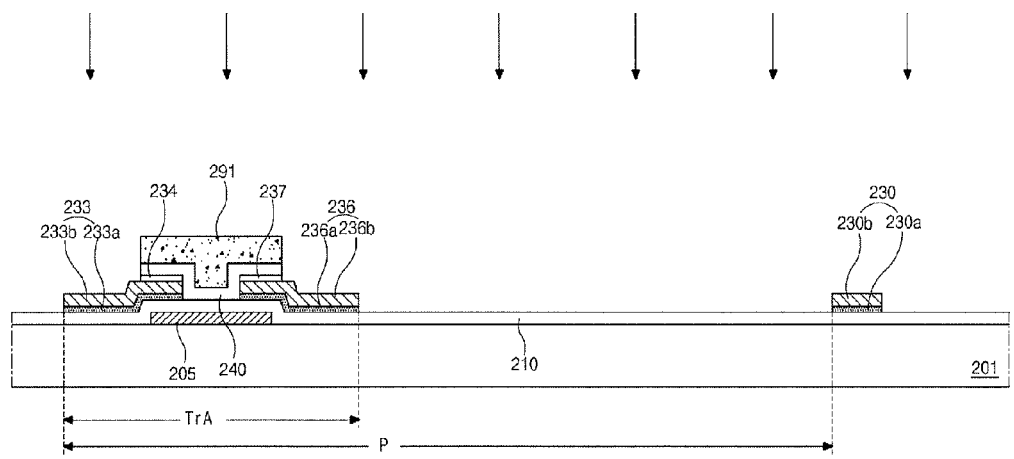

Referring to FIG. 6E, the oxide semiconductor material layer 239 (of FIG. 6D) is exposed to the etchant using the PR pattern 291 as a mask such that a portion of the oxide semiconductor material layer 239 exposed beyond the PR pattern 291 is etched. As a result, the oxide semiconductor layer 240 having an island shape is formed under the PR pattern 291.

In this instance, not only the oxide semiconductor layer 239 but also the first to third transparent conductive patterns 230c, 233c and 236c react with the etchant including oxalic acid and are etched. Accordingly, as shown in FIG. 6F, the first transparent conductive pattern 230 and a portion of the second and third transparent conductive patterns 233c and 236c (of FIG. 6E) exposed beyond the oxide semiconductor layer 240 are removed such that the first and second adhesion enhancing layers 234 and 237 are formed on the source and drain electrodes 233 and 236, respectively, and under the oxide semiconductor layer 240.

Figure 6G:
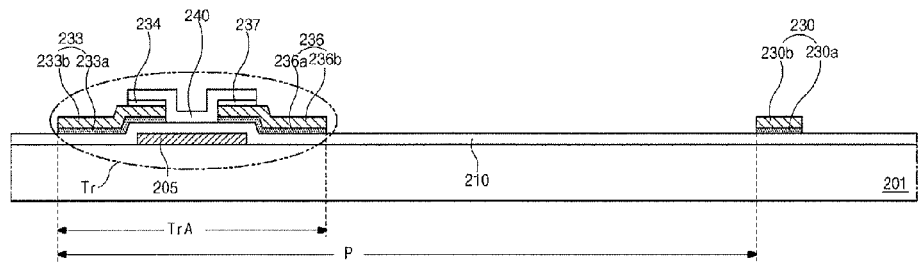

Next, as shown in FIG. 6G, the PR pattern 291 (of FIG. 6F) is removed by a stripping process or an ashing process such that the oxide semiconductor layer 240 is exposed. The gate electrode 205, the gate insulating layer 210, the source electrode 233, the drain electrode 236, the first and second adhesion enhancing layers 234 and 237 and the oxide semiconductor layer 240 constitute the TFT "Tr" as a switching element in the switching region "TrA".

Figure 6H:
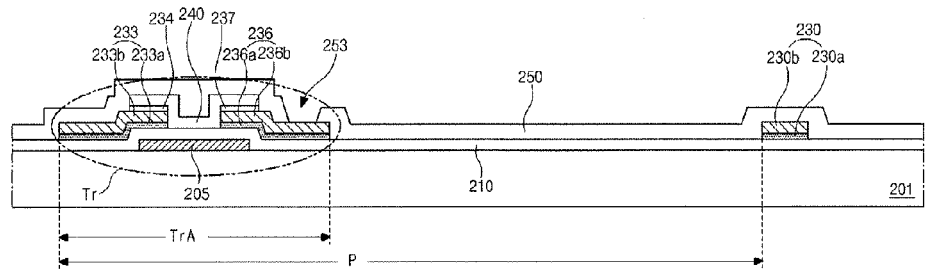

Next, as shown in FIG. 6H, the passivation layer 250 is formed over the substrate 201 including TFT "Tr" by depositing an inorganic insulating material, e.g., silicon oxide or silicon nitride, or coating an organic insulating material, e.g., photo-acryl or benzocyclobutene (BCB). FIG. 6H shows the single layered passivation layer 250 of silicon oxide. Alternatively, the passivation layer 250 may have a multi-layered structure. In this instance, the multi-layered structure passivation layer 250 may include different organic insulating materials or inorganic insulating materials. On the other hand, the passivation layer 250 may include a lower layer of the inorganic insulating material and an upper layer of the organic insulating material.

Figure 6I:
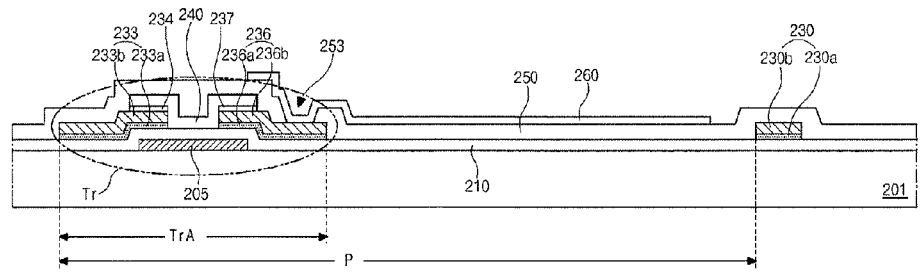

Next, the passivation layer 250 is patterned by a mask process to form a drain contact hole 253 exposing a portion of the drain electrode 136. Then, as shown in FIG. 6I, a transparent conductive material layer is formed on the passivation layer 250 by depositing a transparent conductive material, e.g., ITO or IZO. The transparent conductive material layer is patterned by a mask process to form the pixel electrode 260. Further, the pixel electrode 260 has a plate shape and contacts the drain electrode 136 through the drain contact hole 253. As a result, the array substrate is obtained.

Next, FIGS. 7A to 7E are cross-sectional views illustrating a fabricating process of an array substrate according to the third embodiment of the present invention. The switching region "TrA", where the TFT "Tr" is formed" is defined in the pixel region "P".

Figure 7A:
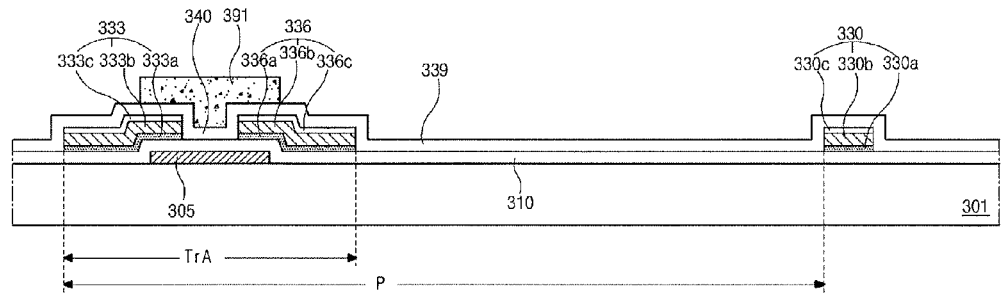
FIGS. 7A to 7E are cross-sectional view views illustrating a fabricating process of an array substrate according to the third embodiment of the present invention.

As shown in FIG. 7A, the gate electrode 305, the gate insulating layer 310, the source electrode 333, the drain electrode 336, the data line 330, the oxide semiconductor material layer 339 and the PR pattern 391 are formed on the substrate 101. The processes are substantially the same as the processes shown and explained with references FIGS. 6A to 6D. On the other hand, the first to third transparent conductive patterns 230c, 233c and 236c are defined as third layers 330c, 333c and 336c. Namely, each of the data line 330, the source electrode 333 and the drain electrode 336 has a triple-layered structure.

Figure 7B:
Figure 7B:
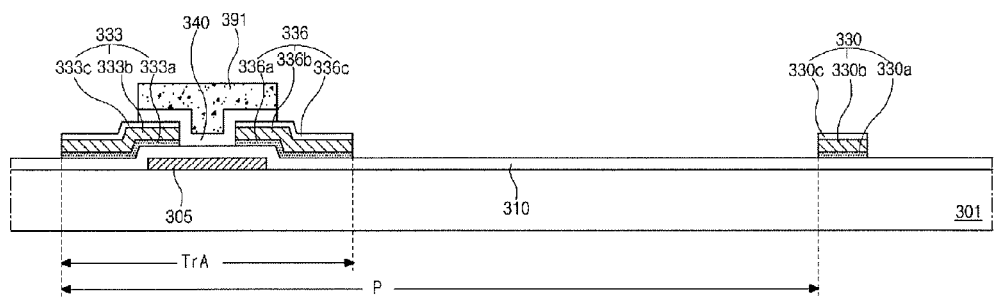
Figure 7C:
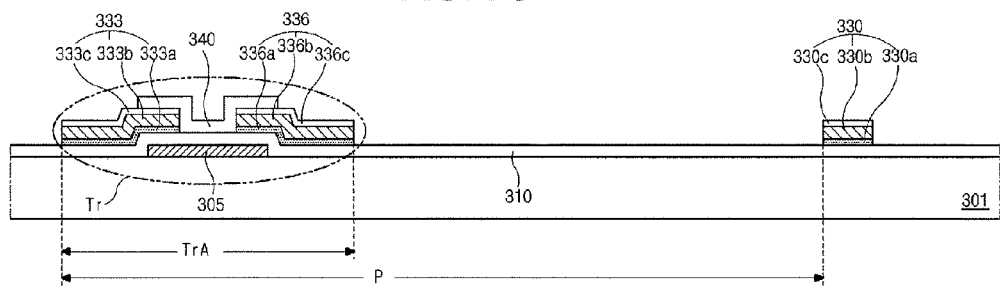
Figure 7D:
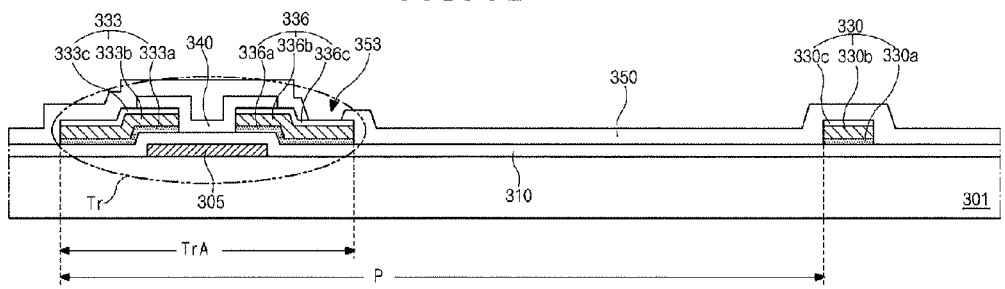
Figure 7E:
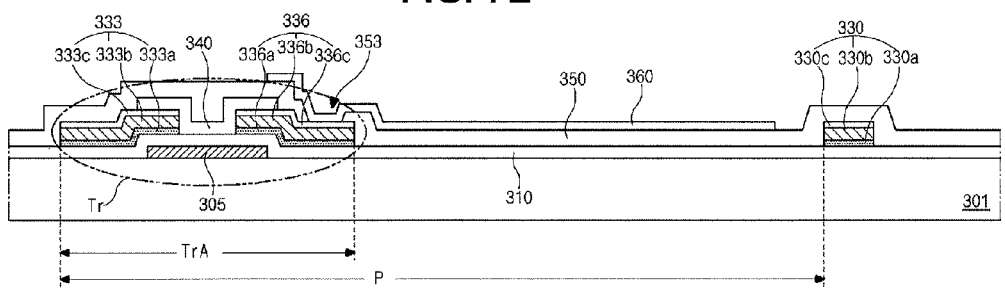

Next, as shown in FIG. 7B, the oxide semiconductor material layer 339 (of FIG. 7A) is etched by a dry-etching with an etching gas to form the oxide semiconductor layer 340 under the PR pattern 391. In this instance, the third layers 330c, 333c and 336c of ITO or IZO are not etched by the etching gas. As a result, each of the data line 330, the source electrode 333 and the drain electrode 336 maintains the triple-layered structure. Then, as shown in FIGS. 7C to 7E, the PR pattern 391 (of FIG. 7B) is removed, and the passivation layer 350, the pixel electrode 360 are formed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate, the method comprising:
   forming a gate line on a substrate including a pixel region;
   forming a gate electrode on the substrate and connected to the gate line;
   forming a gate insulating layer on the gate line and the gate electrode;
   forming a metal layer on the gate insulating layer;
   patterning the metal layer to form a data line, a source electrode and a drain electrode on the gate insulating layer, the data line crossing the gate line to define the pixel region, the source and drain electrodes corresponding to the gate electrode, the source electrode connected to the data line, and the drain electrode spaced apart from the source electrode:
   forming first and second adhesion layers respectively on the source and drain electrodes by a nitrogen gas-plasma processing on a top layer of the source and drain electrodes: and
   forming an oxide semiconductor layer on top of the first and second adhesion layers,
   wherein the top layer of the source and drain electrodes includes one of copper and copper alloy.

2. The method according to claim 1, further comprising:
   forming a channel region between the source and drain electrodes without using an etch stopper on top of the channel region.

3. A method of manufacturing an array substrate, the method comprising:
   forming a gate line on a substrate including a pixel region;
   forming a gate electrode on the substrate and connected to the gate line;
   forming a gate insulating layer on the gate line and the gate electrode;
   forming a metal layer on the gate insulating layer;

forming a material layer on the metal layer;

patterning the metal layer and the material layer to form a data line on the gate insulating layer, a source electrode and a drain electrode on the gate insulating layer, and a material pattern on the source and drain electrodes, the data line crossing the gate line to define the pixel region, the source and drain electrodes corresponding to the gate electrode, the source electrode connected to the data line and the drain electrode spaced apart from the source electrode;

forming an oxide semiconductor layer on the material pattern; and etching the material pattern using the oxide semiconductor layer as an etching mask to form first and second adhesion layers respectively on the source and drain electrodes, wherein the oxide semiconductor layer partially covers an upper surface of each of the source and drain electrodes such that an upper surface of the first and second adhesion layers is completely covered by the oxide semiconductor layer.

4. The method according to claim 1, further comprising:

forming a passivation layer on the oxide semiconductor layer and including a drain contact hole exposing the drain electrode; and forming a pixel electrode on the passivation layer and in the pixel region, the pixel electrode contacting the drain electrode through the drain contact hole.

5. The method according to claim 3, further comprising:

forming a channel region between the source and drain electrodes without using an etch stopper on top of the channel region.

6. The method according to claim 3, further comprising:

forming a passivation layer on the oxide semiconductor layer and including a drain contact hole exposing the drain electrode; and forming a pixel electrode on the passivation layer and in the pixel region, the pixel electrode contacting the drain electrode through the drain contact hole.

* * * * *